United States Patent
Scott et al.

(10) Patent No.: US 8,014,062 B2
(45) Date of Patent: Sep. 6, 2011

(54) METHOD OF MAKING A CLOSE PROXIMITY FILTER AND MULTI COLOR MWIR SENSOR AND RESULTANT DEVICE

(75) Inventors: Jeffrey W. Scott, Carpinteria, CA (US); Gene R. Loefer, Orlando, FL (US); Nicholas J. Pfister, Buellton, CA (US)

(73) Assignee: Lockheed Martin Corporation, Bethesda, MD (US)

(*) Notice: Subject to any disclaimer, the term of this patent is extended or adjusted under 35 U.S.C. 154(b) by 512 days.

(21) Appl. No.: 12/073,533

(22) Filed: Mar. 6, 2008

(65) Prior Publication Data
US 2008/0231946 A1   Sep. 25, 2008

Related U.S. Application Data

(60) Provisional application No. 60/905,800, filed on Mar. 9, 2007.

(51) Int. Cl.
  *G02B 5/20* (2006.01)
  *G01J 5/02* (2006.01)
(52) U.S. Cl. ... 359/359; 359/589; 250/332; 250/339.02; 250/339.14
(58) Field of Classification Search .................. 250/332, 250/339.02, 339.05, 339.14, 370.01; 359/359, 359/588, 589, 590
See application file for complete search history.

(56) References Cited

U.S. PATENT DOCUMENTS

| | | | | |
|---|---|---|---|---|
| 5,072,109 | A * | 12/1991 | Aguilera et al. | 250/226 |
| 5,138,164 | A * | 8/1992 | Koh | 250/339.02 |
| 5,258,618 | A * | 11/1993 | Noble | 250/332 |
| 5,373,151 | A * | 12/1994 | Eckel et al. | 250/208.1 |
| 5,550,373 | A * | 8/1996 | Cole et al. | 250/338.1 |
| 6,034,372 | A * | 3/2000 | LeVan | 250/352 |
| 7,109,488 | B2 * | 9/2006 | Milton | 250/332 |
| 7,135,698 | B2 * | 11/2006 | Mitra | 257/21 |
| 7,289,264 | B2 * | 10/2007 | Wu et al. | 359/359 |
| 7,855,786 | B2 * | 12/2010 | Sparks et al. | 356/419 |
| 2005/0063061 | A1 * | 3/2005 | Grawert et al. | 359/586 |
| 2006/0209413 | A1 * | 9/2006 | Kim et al. | 359/577 |
| 2010/0317175 | A1 * | 12/2010 | Sargent et al. | 438/478 |

OTHER PUBLICATIONS

N. S. Gluck et al., "Two-color imaging by the use of patterned optical filters bonded to focal-plane-array detectors", Applied Optics, vol. 35, No. 28, Oct. 1, 1996.*
N. S. Gluck et al, "Two-color imaging by the use of patterned optical filters bonded to focal-plane-array detectors." Applied Optics / vol. 35, No. 28 / Oct. 1, 1996, p. 5520.

* cited by examiner

*Primary Examiner* — Frank G Font
(74) *Attorney, Agent, or Firm* — Birch, Stewart, Kolasch & Birch, LLP

(57) ABSTRACT

The present invention relates generally to a method and apparatus for attaching a close proximity filter to an FPA (focal plane array) and more particularly, to a method and apparatus that allows improved spectral discrimination of a mid-wave infra red (MWIR) detector by applying an improved multi-color filter to a focal plane array (FPA), while employing existing production equipment and techniques to reduce cost and improve production yield.

17 Claims, 8 Drawing Sheets

| Layer | Material | Thickness (QWOT) |
|---|---|---|
| 1 | SiO2 | 1 |
| 2 | Si | 1 |
| 3 | SiO2 | 1 |
| 4 | Si | 2 |
| 5 | SiO2 | 1 |
| 6 | Si | 1 |
| 7 | SiO | 1 |

FIG. 7

METHOD OF MAKING A CLOSE PROXIMITY FILTER AND MULTI COLOR MWIR SENSOR AND RESULTANT DEVICE

PRIORITY

The present application claims priority from provisional application 60/905,800, filed on Mar. 9, 2007. The contents of which are hereby incorporated by reference.

BACKGROUND OF THE INVENTION

1. Field of the Invention

The present invention relates generally to the method of making a multi color mid-wavelength infrared (MWIR) sensor, and a method of attaching a close proximity filter to an focal plane array (FPA) and more particularly, to the detector portion of the FPA. The inventive methods and apparatuses provide improved spectral discrimination for existing FPAs.

2. Description of the Prior Art

Mid-wavelength infrared (MWIR) sensors may be used to detect a jet engine exhaust plume of a target aircraft or missile, or to provide information on the exhaust from an oil refinery. The inventive methods and apparatuses provide improved spectral discrimination for existing FPAs. Currently known solutions for providing this type of performance improvement, however, are complex and costly.

There are a number of approaches in improving the efficacy of an MWIR sensor. For example, FPAs can have a combination of polarization filters and spectral filters or spectral filters with micro lenses added singularly or in combination. Polarization discrimination offers the capability to highlight or suppress different materials in a scene or objects at different orientations. A spectral or close proximity filter with a micro lens array can be used to increase the MTF (modulation transfer function) performance or reduce cross-talk between pixels of existing FPAs.

A spectral or close proximity filter extends the capabilities of existing FPA technology beyond conventional amplitude/intensity imaging. Close proximity filters can be designed for spectral discrimination, polarization discrimination, and may be coupled with micro lens arrays for focusing/directing light.

Another approach to improve the performance of MWIR sensors consist of FPA technology using detectors with multiple wavelengths within the same unit cell. While this provides for a broader range of detection capability this approach is costly and has a low production yield due to complex semiconductor growth and processing issues.

Yet another approach employs detectors with different cut-off wavelengths in the same imaging system. This requires an extremely precise optics design, which uses a beam splitter to focus the incoming signal on two separate detectors with sub 10th pixel accuracy.

SUMMARY OF THE INVENTION

An objective of the present invention is to use an existing FPA and develop a simple, cost-effective filter fabrication and attachment method that may be used with only minimal changes to a standard FPA design. This would allow the resultant FPA to be used without impacting interacting components, optics, and higher-level assemblies, thereby keeping implementation costs low. To allow for discrimination of multiple spectral bands on a pixel by pixel basis, it is preferable for the filter to be in close proximity to, and parallel with, the detector surface, and accurately aligned in the x and y directions, all within a few microns.

The present invention pertains to a method and apparatus for the incorporation of a patterned spectral filter mounted in close proximity to the FPA to provide color selective pixels on the FPA for discrimination of spectral bands in the mid-wavelength infrared band.

A preferred embodiment of a multi-color detector according to the present invention is a 2 color mid-wavelength infrared (MWIR) sensor. A 2 Color MWIR sensor is manufactured by making a patterned close proximity spectral filter and attaching the filter to a focal plane array (FPA), which creates a detector capable of 2 color spectral discrimination in the MWIR band. Incorporation of close proximity filters with an existing FPA, allows for color selective pixels on the FPA for discrimination of spectral bands. A preferred assembly method allows for the use of proximity filters without modifying existing FPA designs. It is also preferable to enable consistent detection across the entire FPA of the sensor for improved target tracking and consistency of detector output. For example, if engine plumes are being tracked through the use of a 2 color MWIR sensor, the plume can be consistently tracked across the entire FPA of the sensor.

One embodiment of the present invention enables the realization of the above spectral discrimination capabilities without requiring changes in the FPA, interacting components such as a dewar, optics design, or fabrication processes. An embodiment of a multi-color detector created according to the present invention allows for the generation of two or more interlaced images on the same detector. This can be realized by applying a patterned band-pass filter (BPF) onto the detector portion of the FPA. An embodiment of such a detector can be created in a fabrication process that maintains a high production yield and results in high operability components.

An embodiment of a BPF can be designed to have a high transmission for a first band and low transmission for a second band. An embodiment of a broad band AR coating can be designed to allow for a high transmission on both bands. In an embodiment of a detector employing such an AR coating, wavelengths outside of the first band will have a high signal when passing through the AR coating, but will have a low signal when passing through the BPF. Such an approach enables an embodiment of a filtered FPA created according to the present invention to have full resolution of an object emitting in second band, while an object emitting outside of the second band will be detected at varying signal levels. Taking a difference signal between the two interlaced images enables the identification of objects emitting in the first band. Multi-layered embodiments of a BPF designed to accept an AR coating may also be constructed in a manner whereby the AR coating comprises a final layer of the BPF.

Attachment of close proximity filters to existing FPAs enables additional spectral information to be extracted from the image at very low additional cost. Many different arrangements are possible for the design of close-proximity filters. One embodiment of a close proximity filter comprises a checkerboard pattern array with alternating pixels, which have different spectral characteristics. For example, half of the array may comprise pixels with a band pass filter (BPF), while the other half comprises pixels with a broad band AR coating. Yet further embodiments of a close proximity filter may have striped, honeycomb, inter-laced, or triangular patterns. The size of the pixels may also be different, requiring different sized filters in some embodiments of a close proximity filter. Embodiments of close proximity filters according to the present invention may also have an AR coating applied to both sides of the filter. The second AR coating may be applied any time during or after filter fabrication. Yet further embodiments of close proximity filters according to the present invention may incorporate more than one type of BPF, providing for spectral discrimination across a plurality of wavebands and thereby allowing detection in three or more colors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 illustrates an embodiment of a deposition recipe for a band-pass filter according to the present invention;

The drawings will be described in detail in the course of the detailed description of the invention.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

The method and apparatus described herein pertains to embodiments of a multi-color MWIR sensor that may be manufactured by making and then attaching at least one type of spectral band-pass filter onto an existing FPA. One embodiment of a sensor created according to this inventive approach is capable of 2 color spectral discrimination in the MWIR band.

Figure 1:
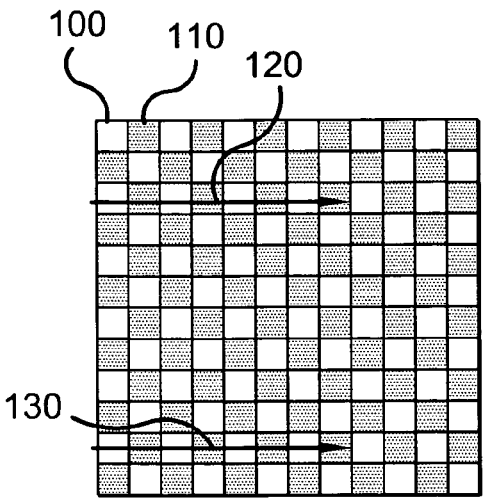
FIG. 1 illustrates an embodiment of a close proximity filter in a checkerboard pattern of alternating pixels with different spectral characteristics.
Figure 3:
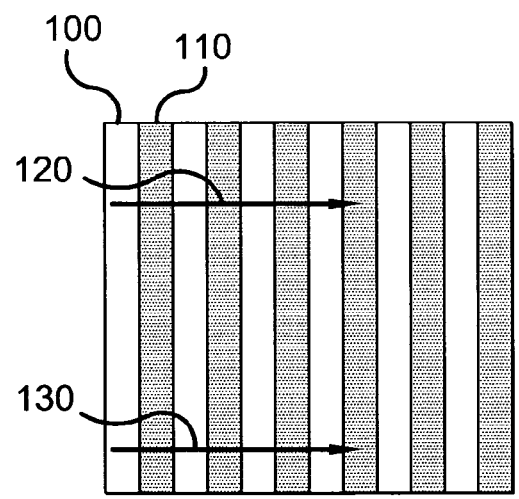
FIG. 3 illustrates an embodiment of a close proximity filter in a striped pattern of alternating filter areas with different spectral characteristics.
Figure 4:
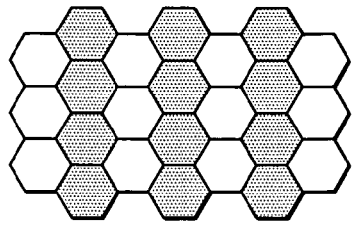
FIG. 4 illustrates an embodiment of a close proximity filter in a honeycomb pattern.
Figure 5:
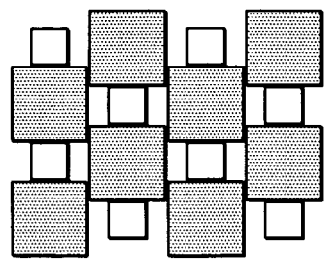
FIG. 5 illustrates an embodiment of a close proximity filter in which alternating pixels have different sizes and the alternating pixels have different spectral characteristics.

FIG. 1 shows a block diagram of an embodiment of a detector array with a close proximity filter (CPF) in a checkerboard pattern where the alternating pixels have different filter characteristics. In the embodiment shown, the shaded areas of the array represent pixels with a BPF (110), while the non-shaded areas represent pixels with only a broad band AR coating (100). Other embodiments of a close proximity filter may employ stripe patterns as shown in FIG. 3 or honeycomb patterns as shown in FIG. 4. Also, an embodiment of a CPF according to the present invention may overlay an array of different sized pixels, requiring a pattern of different sized filter areas. An example of such an embodiment of a CPF is shown in FIG. 5. Alternating sizes can also be used to affect the total light flux and spectral cross talk between pixels. Yet further embodiments of a close proximity filter may employ a super pixel, wherein the super pixel is made up of a number of individual pixels. Such an embodiment may facilitate improved detection at longer wavelengths. The more pixels per unit area that a close proximity filter contains, the higher the data resolution of the filter up to the resolution of the underlying focal plane array. Yet further embodiments of a CPF according to the present invention may three or more different types of filter areas, each with different filter characteristics.

Figure 2:
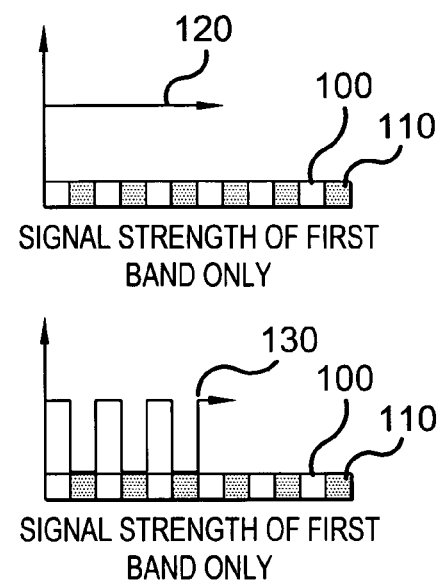
FIG. 2 illustrates spectral characteristics of a checkerboard pattern array according to the invention with alternating pixels.

In one embodiment of a close proximity filter as shown in FIG. 1, half of the array may comprise pixels with a type of a BPF known as a narrow pass, or spike, filter (110), while the other half may comprise pixels with a broad band AR coating (100). Such an embodiment may have a BPF designed to have a high transmission for a first band (120) and low transmission for a second band (130). Such an embodiment may also have a broad band AR coating designed so that both bands (120 and 130) have a high transmission. As shown in FIG. 2, wavelengths emitted in a first band (120) will have a high signal as they pass across both pixel types. FIG. 2 also shows wavelengths emitted outside of a first band (120) will have a high signal as they pass across a pixel with the broad band AR coating, but will have a low signal when they pass across a pixel with an embodiment of a BPF. The resultant effect of an embodiment of a filter as described above is an FPA that has full resolution of an object emitting wavelengths in a second band (130). An object emitting wavelengths in both bands (120, 130) will exhibit a fluctuation pattern in its signal strength as it moves across the array. This variable signal strength image is interlaced with the first, full resolution image. Because the variations in signal strength are a result of wavelength emissions in a second band outside of the first band, taking a difference signal between the two interlaced images will identify objects emitting in a second band (130).

Filter Composition

Figure 6:
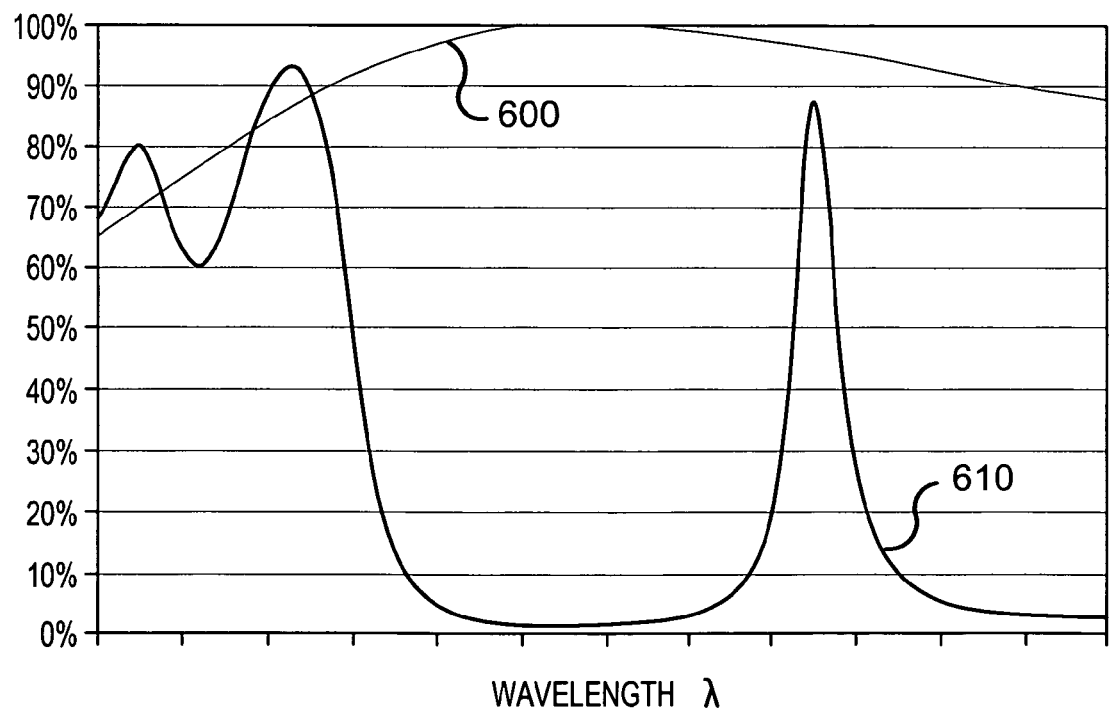
FIG. 6 illustrates an example of a measured transmission response of the band 2 filter in an embodiment of the present invention.
Figure 8A:
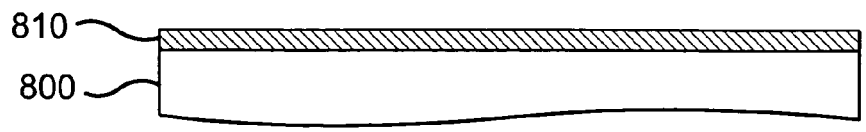
FIG. 8 illustrates an embodiment of a production sequence for filter fabrication according to the present invention.
Figure 8B:
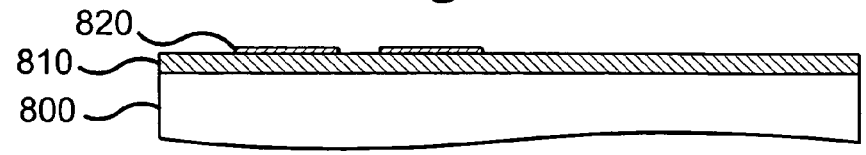
Figure 8C:
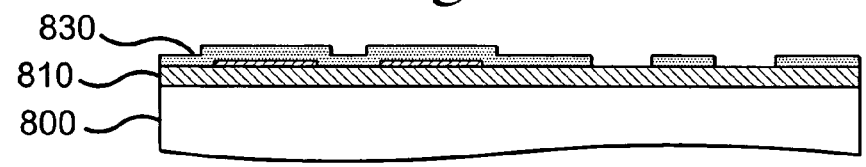
Figure 8D:
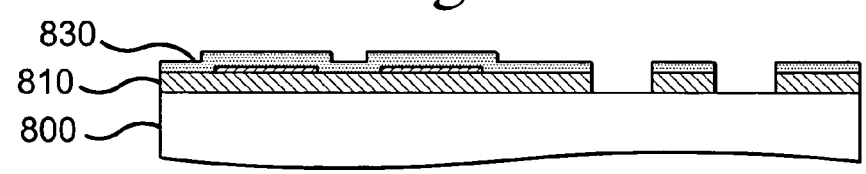
Figure 8E:
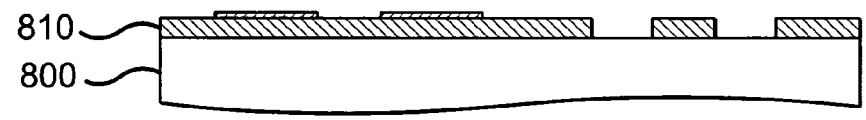
Figure 8F:
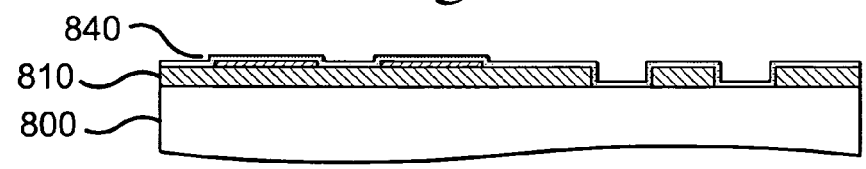
Figure 8G:
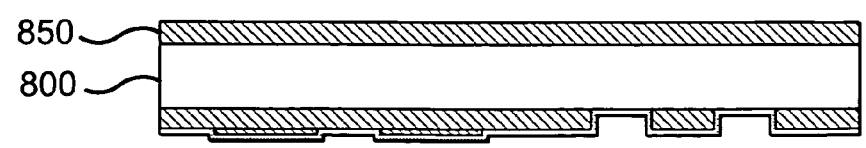

FIG. 6 shows the response of the AR coating (600) and the BPF (610) in an embodiment of a CPF according to the present invention. The BPF is centered at λ. The AR coating allows a large band of wavelengths to pass through. The BPF allows only the wavelength λ to pass through and suppresses most of the other wavelengths that can otherwise pass through the AR coating. The net effect of such an embodiment of a 2-color filter is to create two filter areas. The first filter area is a band-pass filter area, which allows a specific wavelength or wavelengths to pass through. This functions as a narrow-band filter. The second filter area allows for detection of all the wavelengths not filtered out by the AR coating. Differences between the responses of BPF coated areas and AR coated areas enable the detection of signals in two wavelength bands.

Further integrating a spectral cold filter in the optical path enables greater definition of the spectral bands that reach the focal plane array, providing better means for out-of-band wavelength rejection.

In an embodiment of the present invention shown in FIG. 8, a close proximity filter starts with a substrate (800) material that supports the filter components. In the embodiment shown, the substrate (800) is a low-doped, double-polished silicon wafer. Silicon is a preferred material for an embodiment of a CPF for a MWIR detector because it is IR transparent. In an embodiment of the present invention it is preferable to match the coefficient of thermal expansion (CTE) of the CPF to the FPA. In such an embodiment, a material or combination of materials other than silicon may be used as a substrate. In one such alternative embodiment, it may be preferable to use a stacked, composite substrate composed of different material layers of different thicknesses in order to facilitate a substrate with a tailorable composite average CTE. Other embodiments of the present invention may employ germanium, sapphire, glass, gallium arsenide, or a number of other materials as a substrate. Various compound semiconductors may be suitable substrates depending on their coefficient of thermal expansion match to the focal plane array and their transmission spectrum. In addition, filters may be grown by epitaxial methods directly on a semiconductor surface with high accuracy. These filters may then be etched or used in tandem with the filters deposited by dielectric methods. In this embodiment, the substrate material is low doped in order to facilitate and enhance IR transparency. Other embodiments of a filter that is IR transparent may not require a substrate material that is low doped. Also, the substrate material in this embodiment is double polished in order to reduce light scattering. A matte finish substrate or a single side polished substrate may be used in alternative embodiments while further alternative embodiments may accomplish light scattering reductions by methods other than double-polishing, or may employ materials with properties that reduce or eliminate a need for polishing. Yet other embodiments of the present invention may not be affected by light scattering due to specific applications or wavelength detection bands.

A BPF is deposited on the wafer. In a preferred embodiment, the recipe for creating a Si/SiO2 BPF is shown in FIG. 7. FIG. 8 shows an embodiment of a fabrication process for making a 2 color MWIR sensor. In this embodiment, a BPF (810) is applied to the front side of a substrate (800). A preferred embodiment of a BPF for mid-wave infra-red (MWIR) detection is a silicon (Si) and silicon dioxide (SiO$_2$) layered filter.

In an embodiment depicted therein in FIG. 7, the BPF consists of seven layers where layer thickness is measured in terms of quarter-wave optical thickness (QWOT) relative to the center wavelength, λ, of the BPF. Layer 1 is a SiO2 layer a quarter wave thick. Layer 2 is a Si layer a quarter wave thick. Layer 3 is a SiO2 layer a quarter wave thick. Layer 4 is a Si layer a half wave thick. Layer 5 is a SiO2 layer a quarter wave thick. Layer 6 is a Si layer a quarter wave thick. Layer 7 is a SiO layer a quarter wave thick, which may comprise an antireflective (AR) coating applied separately from the rest of the BPF in some embodiments of a filter fabrication process according to the present invention. Quarter wave thick means the product of the physical thickness and optical index are one quarter of the design wavelength as is standard in the art. There are a number of alternative material combinations that can be used to create a layered BPF such as: germanium/zinc selenide, silicon/silicon monoxide and silicon/silicon nitride. In addition, any material with a refractive index less than that of Si can be used, such as germanium, GaAs or sapphire glass. In an embodiment of this invention, it is preferable to design the BPF to account for an AR coating that is later applied.

Alternative embodiments of a BPF (810) may contain more or fewer layers, and may employ different materials for the layers depending on the fabrication methods employed and the intended applications for the resultant sensor. Increasing the number of layers in a BPF (810) may increase the spectral sharpness of the filter, but too many layers can make the etching processes more difficult and can extend the length of the etching process and degrade spatial resolution. Alternative embodiments of a fabrication process and alternative embodiments of a multi-color sensor according to the present invention may employ different embodiments of a BPF (810). The number of layers, material composition of the layers, and order and structure of the filter layers may all be adjusted and varied depending on the desired filter tolerances, intended application, and fabrication methods employed. Patterning methods known in the art include etching and liftoff.

In one embodiment of a fabrication process according to the present invention, metal alignment fiducials (820) are deposited onto the BPF (810) after the BPF (810) is applied. An embodiment of the present invention employs a lift-off process for this deposition step. An alternative embodiment of the invention may use a standard pattern process to place metal alignment fiducials (820) on the outside of the filter array. The metal alignment fiducials (820) may be used to mark the corners of the filter and may also be used to line up the x and y coordinates of the filter. Other embodiments of the fabrication process may employ different deposition and placement techniques, may use a different material for the fiducials (820), or may omit the fiducials (820) altogether and employ an alternative method and means of alignment and marking.

In an embodiment of a fabrication process according to the present invention, the metal alignment fiducials (820) and BPF (810) are patterned with a mask (830) after the fiducials (820) have been deposited on the BPF (810). A preferred embodiment employs a positive mask made of aluminum metal. Other embodiments of a fabrication process according to the present invention may employ a mask (830) of another material or a photo resist layer (830). Yet other embodiments may employ both a mask and a photo resist layer, while other embodiments may omit these features and steps. If a mask (830) is to be used in an embodiment of this invention, it is preferential to use a mask (830) that will resist the filter etching process and keep its shape. It is also preferred to use a material that can be easily removed after the etching process has been completed.

After the mask (830) is applied in this embodiment of the fabrication process, the BPF (810) is etched to remove the non-masked areas. Embodiments of the etching process may be accomplished with an inductively coupled plasma etch system (ICP), electron cyclotron resonance (ECR) system, reactive ion-etching (RIE) system, wet etch or other etching process. The etching material should be tailored to the material that is going to be etched, the BPF (810), and should not etch the substrate (800) or the patterned mask (830). Certain material combinations work better together because etching can be preformed faster and some materials tend to etch directly downward without expanding under the mask into unwanted areas. Etching systems may employ etching substances such as carbon tetrafluoride ($CF_4$), and sulfur hexafluoride ($SF_6$). Alternative embodiments of a fabrication process according to the present invention may employ a photoengraving process as an alternative or supplement to etching.

Although a mask (830) is shown in FIG. 8, in other embodiments, the fabrication process according to the present invention may not make or use a patterned mask and even eliminate the etching or engraving process altogether. Alternative embodiments of a fabrication process according to the present invention may deposit a pre-patterned BPF (810) onto the substrate, or deposit BPF (810) material in a specified pattern or arrangement. An alternate method is to deposit half of the BPF, withdraw the wafer from the chamber, pattern with resist and deposit additional material to shift the center wavelength, liftoff the excess material and resist and then complete the BPF uniformly over the wafer. This approach provides two narrow band filters shifted from each other. The advantage is that very little material needs to be deposited and the surface is nearly planer. Many other variations on these disclosures will be apparent to those skilled in the art of optical coatings.

In an embodiment of a fabrication process according to the present invention the mask (830) is removed in a developing process with a Metal Ion Free (MIF) developer. Such a developing process is suitable for embodiments of a positive-masked etching or photoengraving process. Other developers or mask removal substances may be appropriate for alternative embodiments of the fabrication process that employ different mask or photo resist materials, or that employ different etching or photoengraving processes or developing.

One embodiment of the fabrication process according to the present invention calls for a broad band AR coating (840) to be deposited onto a patterned BPF. One embodiment of an AR coating deposition process applies an AR coating (840) comprising a quarter wavelength of SiO on top of the patterned BPF (820), metal alignment fiducials (810) and the substrate (800). AR coating (840) deposition is accomplished in the present embodiment of the fabrication process by an evaporation system. Alternative embodiments of a fabrication process according to the present invention may employ alternative AR coating (840) deposition methods or may place the AR coating (840) in a certain pattern. Embodiments may have an AR coating (840) composed of materials such as silicon monoxide, silicon dioxide, or anything with a specific index of refraction lower than silicon such as silicon nitride or zinc selenide. Other substances may be preferred for different embodiments of 2-color sensors or different embodiments of fabrication processes according to the present invention. Embodiments of BPFs in the present invention are preferably designed to take into account the AR coating (840) deposited on top of the filter during the course of an embodiment of a fabrication process according to the present invention. The present embodiment employs one quarter wavelength of thickness of SiO as an AR coating (840). Alternative embodiments may apply thicker or thinner layers of AR coating (840) depending on the intended application of the resultant detector.

Further embodiments of the present invention may apply an AR broad band coat to the back side of the substrate (800). Embodiments of such a back side AR coating may be composed of silicon or silicon monoxide. Other substances may be preferred for different embodiments of 2-color sensors or different embodiments of fabrication processes according to the present invention. Alternative embodiments may apply thicker or thinner layers of AR coating (850) depending on the intended application of the resultant detector.

The wafer may be diced by a variety of methods including a dicing saw or a laser. After dicing the wafer into individual filters, embodiments of a fabrication process according to the present invention may proceed to attachment of the filters to the FPA.

Filter Fabrication

In one embodiment of the present invention, a close proximity filter is fabricated from low doped, double side polished silicon wafers. Alternative embodiments may employ a different filter width or material. Silicon is a preferred material for an embodiment of a 2-color MWIR detector because it is IR transparent, and can be CTE (coefficient of thermal expansion) matched to the rest of the structure. Other embodiments of the present invention may employ germanium, sapphire, glass, or a number of other materials. In this embodiment, the filter material is low doped in order to facilitate and enhance IR transparency. Other embodiments of a filter that is IR transparent may not require a material that is low doped. Also, the filter material in this embodiment is double polished in order to reduce light scattering. Alternative embodiments may accomplish light scattering reductions by methods other than double-polishing, or may employ materials with properties that reduce or eliminate a need for polishing. Yet other embodiments of the present invention may not be affected by light scattering due to specific applications or wavelength detection bands.

Figure 9:
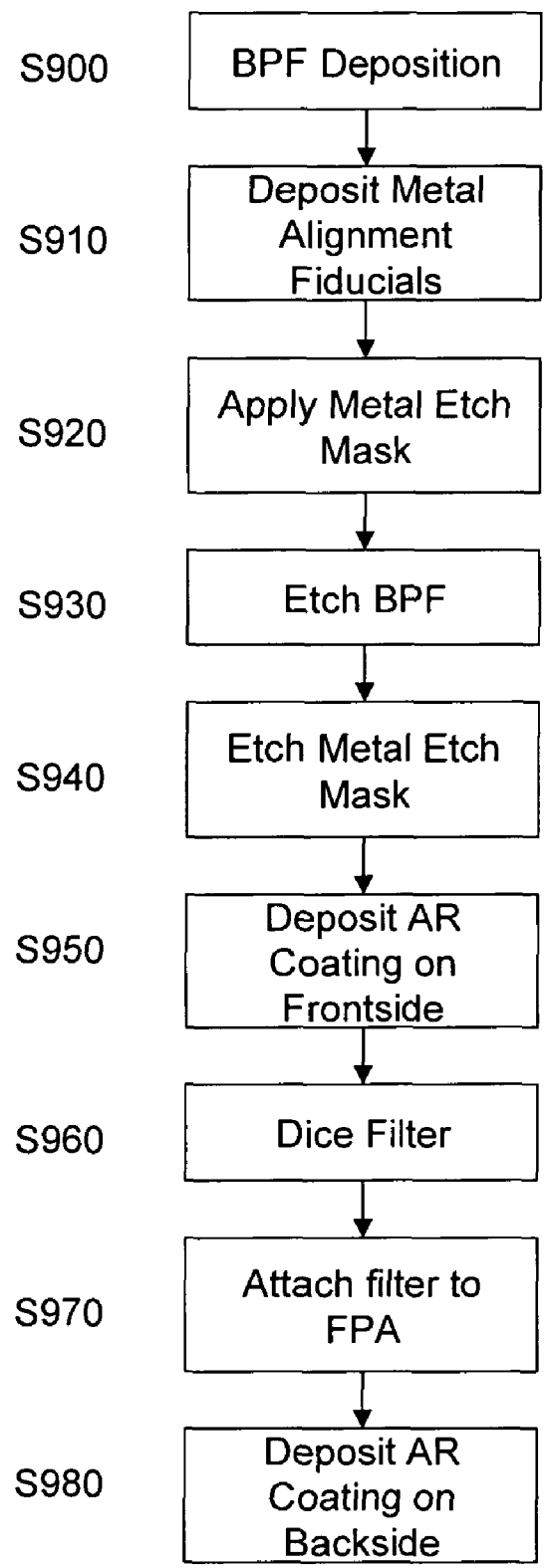
FIG. 9 shows an embodiment of a filter fabrication process according to the present invention.

FIG. 9 presents a flow diagram depicting the operational steps involved in filter fabrication according to the present invention. In this embodiment a BPF is applied to the front side of a wafer (S900) by a thermal evaporation method. In the embodiment shown, the wafer is a low-doped, double-polished silicon wafer. Alternative embodiments of the fabrication process may employ different wafer materials, but the basic steps and underlying inventive concepts are equally applicable.

One embodiment of a BPF used in an embodiment of a filter fabrication process is a silicon/silicon dioxide filter. There may be a number of layers present in the filter. Increasing the number of layers in a BPF may increase the sharpness of the filter, but too many layers can make the etching processes more difficult and can extend the length of the etching process. Alternative embodiments of a fabrication process and alternative embodiments of a 2-color sensor according to the present invention may employ different embodiments of a BPF. The number of layers, material composition of the layers, and order and structure of the filter layers may all be adjusted and varied depending on the desired filter tolerances, intended application, and fabrication methods employed. In alternative embodiments, the BPF may be applied by ion assisted deposition (IAD), reactive ion plating, sputtering, chemical vapor deposition (CVD), plasma enhanced CVD, molecular beam epitaxy (MBE), metal-organic CVD or other methods.

In one embodiment of a fabrication process according to the present invention, metal alignment fiducials are deposited (S910) onto the BPF after the BPF is applied (S900). A standard pattern process may be used to place metal alignment fiducials on the outside of the filter array. The metal alignment fiducials may be used to mark the corners of the filter and may also be used to line up the x and y coordinates of the filter. These fiducials are also deposited by thermal evaporation in the present embodiment, and may be deposited in alternative embodiments by the same set of alternative deposition methods as are available for BPF deposition. Other embodiments of the fabrication process may also employ different placement techniques, may use a different material for the fiducials, or may omit the fiducials altogether and employ an alternative method and means of alignment and marking.

In an embodiment of a fabrication process according to the present invention, the metal alignment fiducials and BPF are patterned (S920) with a mask after the fiducials have been deposited on the BPF. The present embodiment employs an aluminum metal positive mask applied using a lift-off metallization technique. Other embodiments of a fabrication process according to the present invention may employ a mask of another material, a negative mask, or a photo resist layer. Yet other embodiments may employ both a mask and a photo resist layer, while other embodiments may omit these features and steps.

After the mask is applied in this embodiment of the fabrication process, the BPF is etched (S930) to remove the non-masked areas. Embodiments of the etching process may be accomplished with an inductively coupled plasma etch system (ICP), ECR system, reactive ion-etching (RIE) system or other etching process. An embodiment of the fabrication process according to the present invention may preferably employ an embodiment of an ICP etch system using carbon tetrafluoride ($CF_4$). ICP etch is preferable in some embodiments and for certain material combinations because it has a fast rate of etch and tends to etch directly downward without expanding under the mask into unwanted areas. Other embodiments of an ICP etch system may employ etching substances such as sulfur hexafluoride ($SF_6$). Alternative embodiments of a fabrication process according to the present invention may employ a photoengraving process as an alternative or supplement to plasma etching, and yet further embodiments of a fabrication process according to the present invention may avoid a need for making and etching or engraving by depositing a pre-patterned BPF or depositing BPF material in a specified pattern or arrangement.

In an embodiment of a fabrication process according to the present invention the mask is removed (S940) in a developing process with an MIF developer. Such a developing process is suitable for the present embodiment of a positive-masked etching or photoengraving process. Other developers or mask removal substances may be appropriate for alternative embodiments of the fabrication process that employ different mask or photoresist materials, or that employ different etching or photoengraving processes or developing.

One embodiment of the fabrication process according to the present invention calls for a broad band AR coating to be deposited (S950) onto a patterned BPF. One embodiment of an AR coating deposition process applies an AR coating comprising a quarter wavelength of SiO on top of the patterned BPF, metal alignment fiducials and the wafer. AR coating deposition (S950) is accomplished in the present embodiment of the fabrication process by a thermal evaporation system. Alternative embodiments of a fabrication process according to the present invention may employ alternative AR coating deposition (S950) method such as ion assisted deposition (IAD), reactive ion plating, sputtering, CVD, plasma enhanced CVD, molecular beam epitaxy (MBE), metal-organic CVD or other methods. Yet further embodiments of the present invention may apply (S970) an AR backside coating prior to the application of a BPF layer. Embodiments of an AR coating may be composed of silicon or silicon monoxide. Other substances may be preferred for different embodiments of multi-color sensors or different embodiments of fabrication processes according to the present invention. Embodiments of BPFs in the present invention must be designed to take into account the amount of AR coating to be placed on top of the filter during the course of an embodiment of a fabrication process according to the present invention. The present embodiment employs one quarter wavelength of thickness of an AR coating. Alternative embodiments may apply thicker or thinner layers of AR coating depending on the intended application of the resultant detector.

In an embodiment of a fabrication process for a 2-color MWIR detector according to the present invention, an AR broad band coat may also be applied (S980) to the back side of the substrate using a thermal evaporation technique. In alternative embodiments, this AR coating may be applied by ion assisted deposition (IAD), reactive ion plating, sputtering, CVD, plasma enhanced CVD, molecular beam epitaxy (MBE), metal-organic CVD or other methods. Various embodiments of fabrication processes may allow for this application of an AR broad band coat before, after, or during any of the other filter fabrication steps. In the present embodiment, the AR broadband coat is applied (S980) to the back side of the substrate after the filter is diced (S960) and attached (S970) to the FPA. The AR coat is applied (S980) to the back side of the FPA after the filter attachment (S970) in this embodiment to prevent scratching or chipping that may occur during subsequent fabrication or production steps. Alternative embodiments of the present invention may apply an AR coating to the back side of the wafer prior to dicing the wafer into dies or modules. In such embodiments, the AR coating provides additional protection for the dies during dicing and hybridization as is known to those skilled in the art.

The wafer may be diced (S960) by a variety of methods including a dicing saw or a laser. After dicing the wafer into individual filters, embodiments of a fabrication process according to the present invention may proceed to attachment of the filters to the FPA.

Filter Attachment

Figure 10:
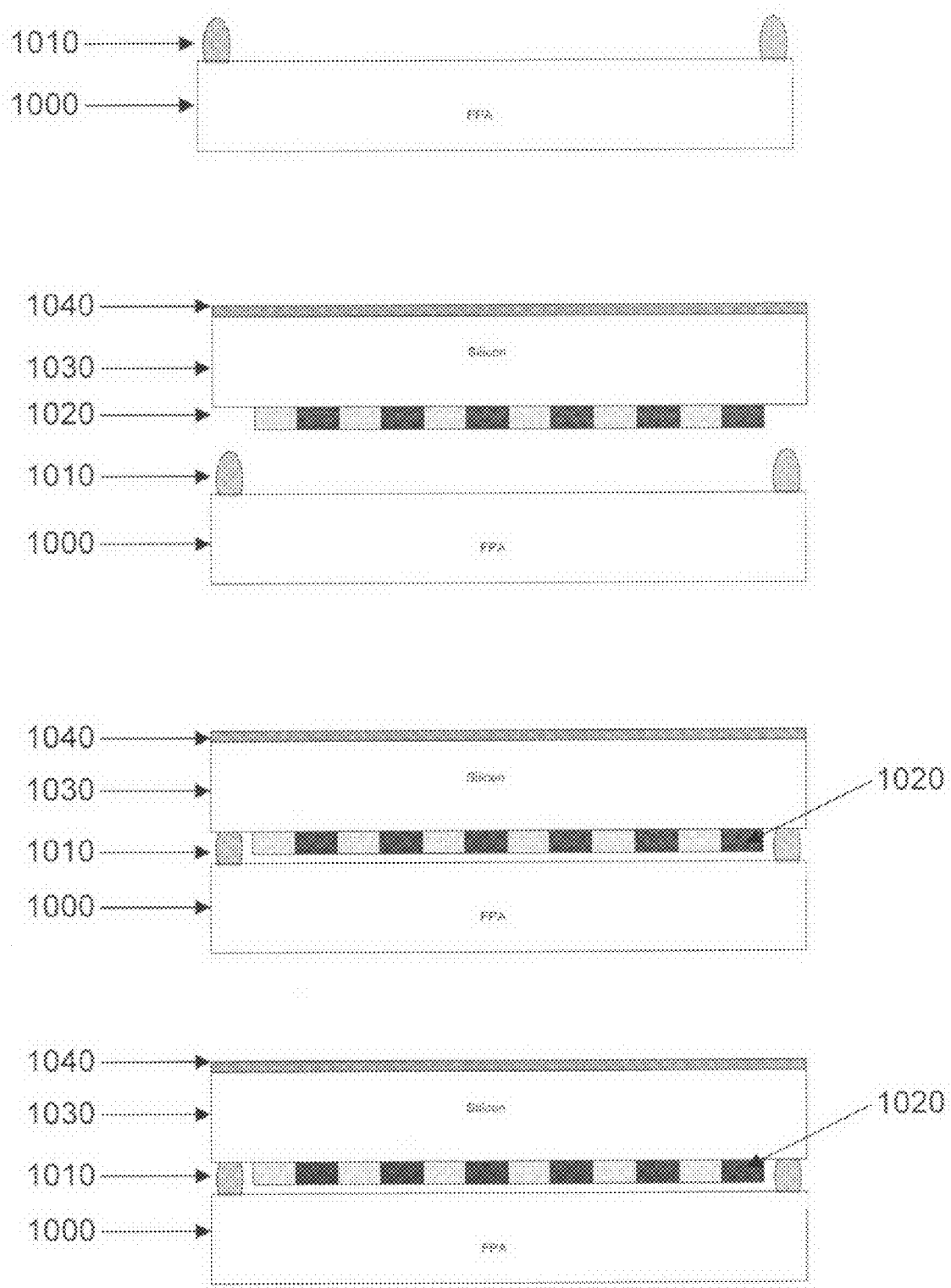
FIG. 10 illustrates an embodiment of a production sequence for filter attachment according to the present invention.

FIG. 10 shows an embodiment of a filter attachment process according to the present invention. The embodiments of the alignment and bonding processes employed in this embodiment of the attachment process were developed using a high accuracy, flip chip placement machine that is used for routine FPA hybridization. Standard machine trays and chucks may used to hold the parts in this embodiment of the filter attachment process.

The FPA (1000) is placed upright and epoxy or adhesive (1010) may be patterned on the FPR (1000). One embodiment present invention uses a cryogenic-grade epoxy as an adhesive (1010). There are many different types of adhesives and epoxies that can be used. Additionally, cold-welding or solder reflow techniques employing materials such as indium may also be used instead of adhesives in some embodiments.

The silicon substrate (1030) with the attached BPF (1020) and AR backside coating (1040) rests BPF-side down over the FPA (1000). The BPF (1020) may be of any previously described pattern, material composition, and layer structure.

The standard alignment process aligns the filter (1020, 1030, 1040) and FPA (1000) and lowers the filter onto the FPA (1000). In one embodiment, the attachment area of the filter to the perimeter of the MUX portion of the FPA may be as small as 1 mm in width. In such an embodiment, only a small amount of adhesive may be applied. An epoxy with high adhesive strength, capable of being applied in very small dot diameters, is preferable for an embodiment of a filter attachment process capable of handling such a small attachment area. Specific epoxies suitable for such an embodiment of the attachment process include EC2216 with glass beads, which is a flexibilized epoxy with excellent thermal cycling resistance and adhesive strength. This epoxy also has the correct viscosity to apply an optimum dot profile. Epoxies of this type may also be used for assembly of other dewar components, and may be qualified for cryogenic and vacuum dewar applications. In an embodiment of the invention, the close proximity filter attached to within 10 µm of the focal plane array surface. Alternative embodiments of attachment processes may use solder, cold-welding or other attachment methods.

Yet further alternative embodiments of a filter attachment process according to the present invention may employ different types of epoxy with different characteristics, requiring alternative hybridization processes or equipment. Alternative embodiments of the attachment process may also vary the distance between an embodiment of a multi-color CPF and its associated FPA by altering the amount or composition of epoxy or other attachment material used.

Indium can be used as a bonding agent in cold-welding embodiments of a filter attachment process. Unlike embodiments that employ an epoxy adhesive (1010), a cold-welded filter and FPA assembly does not need to be heat cured after attachment. Epoxy processes generally require heat-curing in an oven, and most such embodiments will use a standard heating profile.

Figure 11:
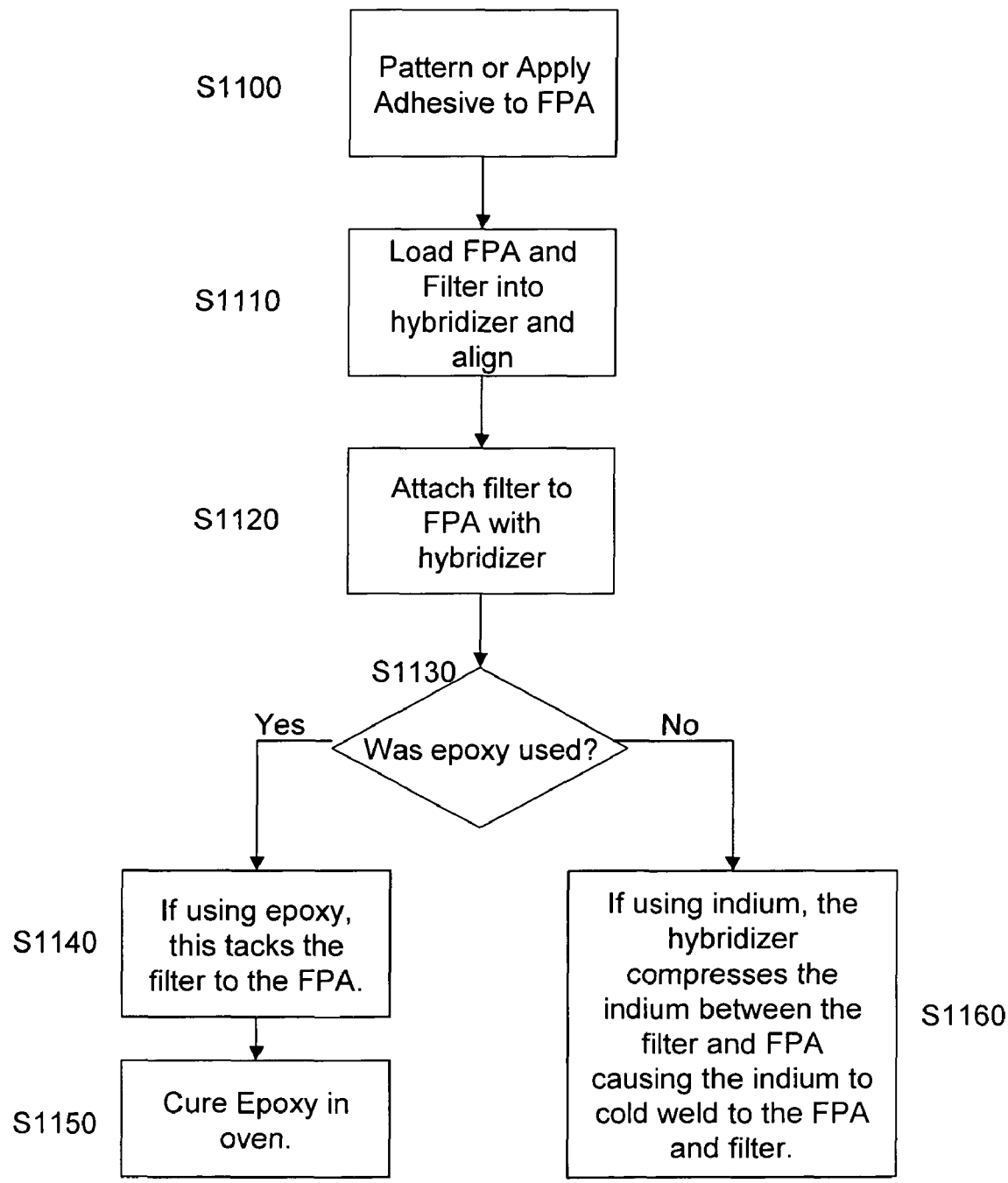
FIG. 11 shows an embodiment of a filter attachment process according to the present invention.

FIG. 11 shows a flow diagram depicting the operational steps involved in an embodiment of a filter attachment process according to the present invention. This embodiment of the attachment process begins with epoxy or adhesive patterned or applied to the FPA (S1100). In an alternative embodiment the adhesive or epoxy may not be patterned on to the FPA. In a further embodiment the epoxy or adhesive may be applied when the FPR and/or filter is loaded in the attachment machine.

In this embodiment the FPA and filter are then loaded (S1110) into a hybridizer that uses a flip-chip technique to attach (S1120) the filter to the epoxy-bearing FPA. The FPA is placed face up on the bottom chuck and the filter is held on the upper chuck face down (S1110), and then the two components are aligned and pressed together (S1120). Alternative embodiments of a filter attachment process according to the present invention may employ different die placement and die bonding processes and equipment, such as customized fixturing tools, solder-bumped flip-chip placement (for solder-based attachment), plated bump flip-chip placement (for cold welding attachment), and mechanical alignment tooling (S1110).

In the present embodiment of a filter attachment process, a hybridizer aligns (S1110) the filter and FPA through standard alignment techniques. Gross and fine alignments may be made to better align the metal fiducial patterns on the filter to the metal on the multiplexer (mux) of the FPA at opposite diagonal corners. Adjustments may be made in small (0.1 µm or less) increments for the final alignment. Embodiments of an attachment process may also employ laser leveling to adjust the parallelism of the FPA to the filter.

Once the components are aligned properly, the hybridizer attaches the filter to the FPA (S1120) by moving one or more of the chucks towards each other. In one embodiment of a filter attachment process according to the present invention, an epoxy may be used to tack (S1140) the filter to the FPA. In an embodiment of such an attachment process, an adhesive may be applied to the filter using a standard stamping process (S1100).

In one particular alternative embodiment of a filter attachment process, Indium may be used an adhesive material. In such an embodiment, the hybridizer compresses (S1160) the indium between the filter and the FPR, causing the indium to cold weld to the FPA and filter. If no epoxy is used or indium is used, the attachment process may comprise only hybridization as no curing process (S1160) is required for soldered or welded joints. In embodiments of the attachment process that employ a traditional epoxy material (S1130) the epoxy tacks the filter to the FPA (S1140) and a curing process (S1150) may be required after hybridization in order to cure and set the epoxy. Embodiments with a curing step may comprise curing in an oven using a standard heat curve.

Experimental Results

Figure 12:
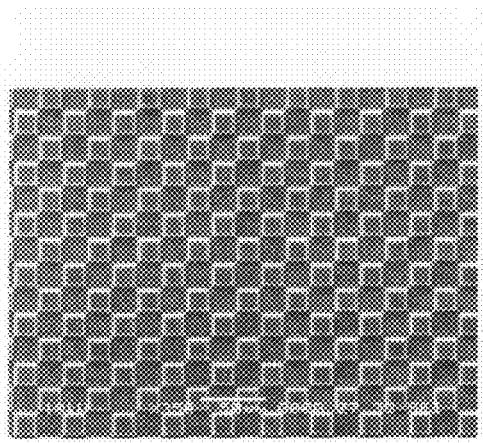
FIG. 12 illustrates an example of an SEM micrograph of dry-etched filter in an embodiment of the invention.
Figure 13:
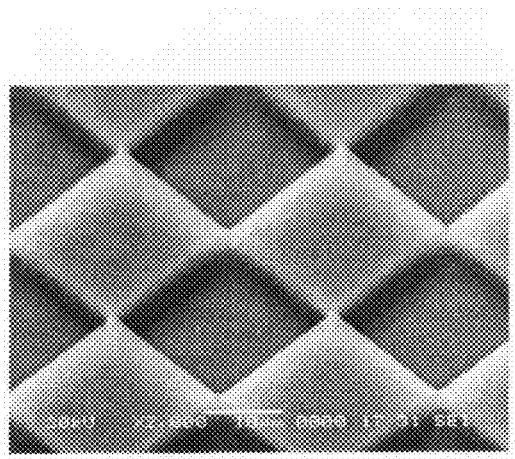
FIG. 13 illustrates an example of an SEM micrograph of dry-etched filter in an embodiment of the invention.

FIGS. 12 and 13 illustrate examples of an SEM micrograph of dry-etched filter in an embodiment of the invention.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A pixel-level patterned band-pass filter applied to a focal plane array, the filter comprising:
   a substrate material;
   a band-pass filter applied in a specified pixel-level pattern to a first side of said substrate; and
   a broad-band anti-reflective coating applied to a second side of said substrate;
   where the pixel-level patterned band-pass filter has a specified thickness and material composition;
   where the pattern of the band-pass filter alternates pixel-level filter areas of a narrow detection waveband with pixel-level filter areas of a broad detection waveband;
   where the broad detection waveband includes the narrow detection waveband such that the pattern produces a first image in the broad detection waveband overlapped with a second image in the narrow detection waveband; and
   where the second image is generated at a higher pixel resolution than the first image.

2. The device of claim 1, wherein the patterned band-pass filter includes a substrate material transparent to infra-red radiation.

3. The device of claim 2, wherein the substrate material comprises at least one of: germanium, sapphire, glass, single crystal silicon, and a compound semiconductor material.

4. The device of claim 1, wherein the patterned band-pass filter is attached to the focal plane array module with a cryogenic-grade epoxy.

5. The device of claim 1, wherein the patterned band-pass filter is attached to the focal plane array module with cold-welded indium.

6. The device of claim 1, wherein the first detection waveband is determined by the band-pass filter and the second detection waveband is determined by the anti-reflective coating.

7. The filter of claim 1, where the broad and narrow detection wavebands are mid-wave infra-red wavebands.

8. The filter of claim 1, where the broad detection waveband includes the narrow detection waveband.

9. The filter of claim 1, where the pattern is a checkerboard pattern.

10. The filter of claim 9, where the filtered focal plane array is configured such that it generates an image in the second detection waveband interlaced with an image in the first detection waveband.

11. The filter of claim 1, the filter further comprising an anti-reflective coating disposed on said band-pass filter.

12. The filter of claim 1, wherein the band-pass filter includes multiple layers of material where layer thickness is measured relative to the center wavelength, $\lambda$, of the band-pass filter, the layers comprising:
   a first layer of $SiO_2$ that is one quarter wave thick;
   a second layer of Si that is one quarter wave thick;
   a third layer of $SiO_2$ that is one quarter wave thick;
   a fourth layer of Si that is two quarter waves thick;
   a fifth layer of $SiO_2$ that is one quarter wave thick; and
   a sixth layer of Si that is one quarter wave thick.

13. The filter of claim 1, wherein the filter is applied to the focal plane array such that the filter is within 10 μm of the focal plane array.

14. The filter of claim 1, where the substrate material is low-doped, double side polished silicon.

15. The filter of claim 1, where the pixel-level pattern is configured such that at least one pixel-level filter area is associated with one pixel of the focal plane array.

16. The filter of claim 1, wherein the first and second images are independently processed into first and second corrected images and further wherein said corrected images are combined into at least one of a sum and difference image.

17. The filter of claim 16, where said difference image is the second corrected image adjusted for solar glare and reflections.

* * * * *